United States Patent [19]

Inoue

[11] Patent Number: 4,903,344

[45] Date of Patent: Feb. 20, 1990

[54] SEMICONDUCTOR MEMORY DEVICE WITH STAGGERED SENSE AMPLIFIERS

[75] Inventor: Hiroshi Inoue, Tokyo, Japan

[73] Assignee: Oki Electric Industry Co., Ltd., Tokyo, Japan

[21] Appl. No.: 215,624

[22] Filed: Jul. 6, 1988

[30] Foreign Application Priority Data

Jul. 7, 1987 [JP] Japan ................... 62-168952

[51] Int. Cl.⁴ ............ G11C 7/00; G11C 11/40; G11C 5/06
[52] U.S. Cl. ............................ 365/51; 365/63; 365/206; 365/207
[58] Field of Search ............ 365/51, 63, 72, 206, 365/207, 208, 210; 307/530

[56] References Cited

U.S. PATENT DOCUMENTS

| | | | |
|---|---|---|---|
| 4,586,171 | 4/1986 | Fujishima | 365/207 X |
| 4,700,328 | 10/1987 | Burghard | 365/207 X |
| 4,800,525 | 1/1989 | Shah et al. | 365/51 X |
| 4,819,207 | 4/1989 | Sakui et al. | 365/207 |

FOREIGN PATENT DOCUMENTS 130887 10/1981 Japan .
208691 12/1982 Japan .
129460 7/1984 Japan .

OTHER PUBLICATIONS

"A 16 Mb DRAM With An Open Bit-Line Architecture" 1988 IEEE International Solid-State Circuits Conference; Session XVI: Dynamic Memory, Feb. 19th, 1988, pp. 246-247.

Primary Examiner—Stuart N. Hecker
Assistant Examiner—Alyssa H. Bowler
Attorney, Agent, or Firm—Spencer & Frank

[57] ABSTRACT

In a semiconductor memory device of an open bit line configuration including a plurality of memory cells arranged in rows and columns, bit lines for adjacent columns are offset by about half their length in the column direction, and each bit line is terminated so as not to overlap, in the vertical direction, the sense amplifier of the bit line for the next column.

8 Claims, 6 Drawing Sheets

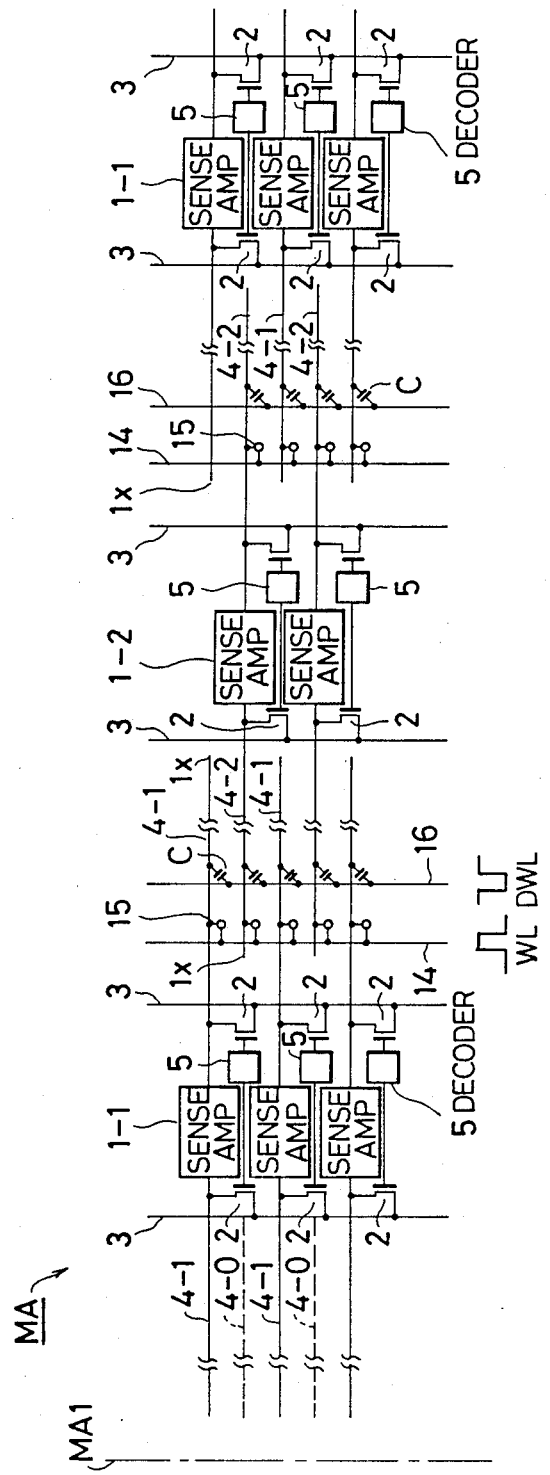
F I G. 5

SEMICONDUCTOR MEMORY DEVICE WITH STAGGERED SENSE AMPLIFIERS

BACKGROUND OF THE INVENTION

The present invention relates to a semiconductor memory device, and particularly to an improvement of layout of sense amplifiers in a dynamic random access memory (DRAM) for higher integration.

Examples of DRAMs which are widely used are shown in FIG. 1 and FIG. 2, in which a pair of balanced halves of a bit line 4 are connected to a sense amplifier 1 formed of a flip-flop. Memory cells 15 are connected at the intersections formed by the bit lines 4 and word lines 14 orthogonal to the bit lines 4. FIG. 1 shows an open bit configuration in which halves of each bit line 4 extend toward opposite directions from the sense amplifier 1 and each word line 14 intersects only one half of each bit line 4. Input/output lines (data bus lines) 3 also intersect the bit line 4 and are connected to respective halves of each bit line 4 through a switch 2 controlled by a column decoder 5.

FIG. 2 shows a folded bit line configuration in which the halves of each bit line 4 extend in the same direction from the sense amplifier 1, and a word line 14 intersects both halves of the bit line 4. The folded bit line configuration is advantageous in that since the word lines 14 intersect both halves of the bit line 4, the effect of noise is minimized, so that the folded bit line configuration is used in DRAMs of 256 kbits or 1 Mbits. The open bit line configuration on the other hand is suitable for a higher integration because memory cells are connected at all the intersections between the bit lines 4 and word lines 14. With the advancement toward higher integration, the open bit line configuration is now drawing attention again and are considered as a good candidate for 16 Mbit memories, or 64 Mbit memories.

FIG. 3 shows another folded bit line configuration disclosed in Japanese Patent Application Laid-open No. 129460/1984 and Japanese Patent Application No. 208691/1982, in which sense amplifiers 1 are disposed on opposite ends of the bit lines 4 alternately, and one half of each bit line 4 connected to a sense amplifier 1 is disposed between two halves of another bit line 4. This configuration permits two sense amplifiers 1 to be disposed taking a space for four bit lines 4.

In summary, the folded bit line configuration has a limitation in that the memory cells 15 cannot be connected at all the intersections between the bit lines 4 and the word lines 14 and this imposes a limit to the increase in the degree of integration. In the open bit line configuration, each sense amplifier 1 must be disposed within the space, i.e., layout pitch, for one bit line 4, as shown in FIG. 4. This imposes a limit to the increase in the degree of integration.

SUMMARY OF THE INVENTION

An object of the invention is to enable a further increase in the degree of integration.

According to the invention, there is provided a semiconductor memory device of an open bit line configuration, comprising:

a plurality of memory cells arranged in rows and columns;

word lines extending in the row direction for for performing row selection;

bit lines extending in the column direction for performing column selection; and sense amplifiers disposed in the center of the respective bit lines;

wherein bit lines for adjacent columns are offset by about half their length in the column direction; and each bit line is terminated so as not to overlap, in the row direction, the sense amplifier of the bit line for the next column.

In the above invention, each bit line is formed to extend not to overlap with the sense amplifier of the bit line for the adjacent column. As a result, the sense amplifier for each column does not approach the bit line for the next column even when the bit line pitch is decreased. That restriction on the reduction in the bit line pitch is removed. This contributes to the increase in the degree of integration.

BRIEF DESCRIPTION OF THE DRAWINGS

FIG. 5 is a schematic view of an embodiment of a semiconductor memory device according to the invention.

DETAILED DESCRIPTION OF THE EMBODIMENTS

Figure 1:
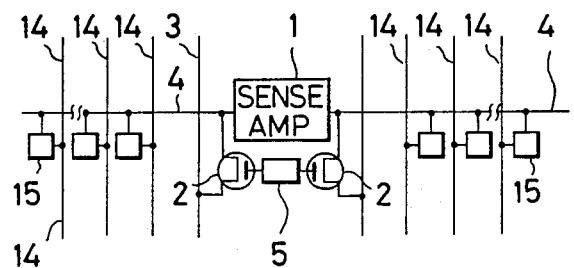
FIG. 1 is a schematic view of an example of a prior art semiconductor memory device.
Figure 2:
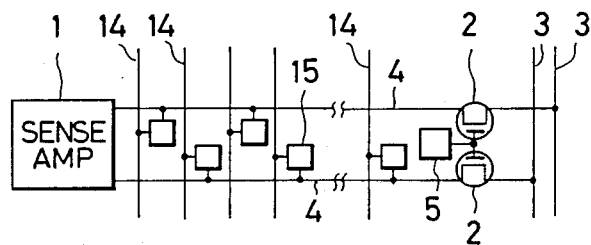
FIG. 2 is a schematic view of another example of a prior art semiconductor memory device.
Figure 3:
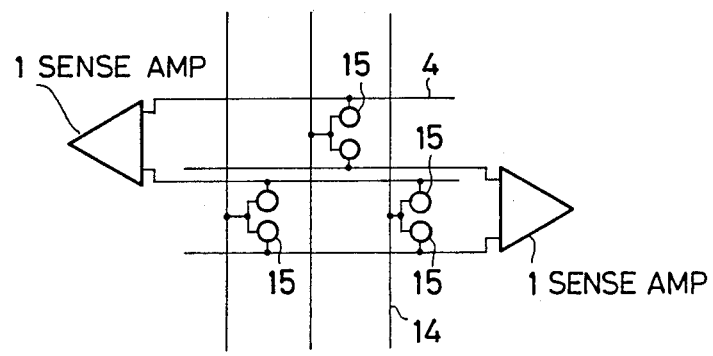
FIG. 3 is a schematic view of another example of a prior art semiconductor memory device.
Figure 4:
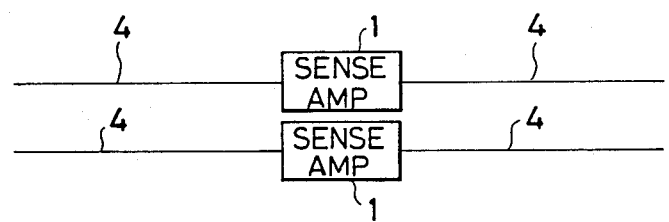
FIG. 4 is a schematic view of another example of a prior art semiconductor memory device.

FIG. 5 is a schematic diagram showing a first embodiment of the invention. Memory cells 15 are arranged both in columns (in the vertical direction as seen in the drawing) and in rows (in the horizontal directions as seen in the drawing). In FIG. 5, part only of the memory cells 15 in a single row are illustrated. Bit lines 4-1, 4-2 for performing column selection are alternately disposed in the vertical direction and extend in the horizontal direction. Each bit line 4 (i.e., 4-1 and 4-2) is formed to extend over part only of a memory cell array. For instance, in a 16 Mbit DRAM, each bit line 4 has a length of about 1/33 of the dimension of the memory cell array in the horizontal direction. This will be better seen from FIG. 6 in which bit lines 4 extend part only of the dimension in the horizontal direction of a memory cell array MA. Sense amplifiers 1-1, 1-2 are provided from which extend, respectively, left and right bit line portions 4-1, 4-1 and left and right bit line portions 4-2, 4-2. Thus the memory cell array MA has an open bit line configuration. Each of the bit line portions 4-1 and 4-2 have respective ends 1X.

Bit lines 4-1 and 4-2 that are provided in adjacent columns in the direction of the rows are staggered or offset by about half the full length of each bit line 4, e.g., of portions 4-1 and 4-2, for each column and are terminated so that adjacent bit line portions 4-1 and 4-2 do not overlap with the adjacent sense amplifiers 1 or with nearby bit line portions 4-1 and 4-2, in the direction of the rows. In addition, column decoders 5 are disposed adjacent the respective sense amplifiers 1. The bit lines 4 in each column do not overlap, with the column decoder 5 for the adjacent, staggered column. In other words, the bit lines 4 in each column are disposed such that there is a space between adjacent confronting ends 1x in the same row (i.e., those connected to sense amplifiers 1 which are disposed in alternate columns—i.e., two columns away—and at the same vertical height of the neighbouring bit lines 4, and a sense amplifier 1 and a column decoder 5 of a bit line 4 for each column are disposed within a vertical column between the confronting ends 1x and staggered with respect to the adjacent ends 1x which extend from adjacent sense amplifiers 1 in adjacent columns. Input/output lines 3 intersect the bit lines 4 and are connected to the respective halves (4-1, 4-1 and 4-2, 4-2) of each bit line 4 through switches 2 controlled by the column decoder 5.

Figure 7:
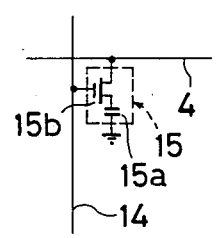
FIG. 7 is a schematic diagram showing an example of a memory cell incorporated in the embodiment of FIG. 5.

A plurality of word lines 14 (only one of them being shown if FIG. 7) for row selection are provided to intersect the bit lines 4-1, 4-2. Memory cells 15 are connected at the intersections between the bit lines 4 and the word lines 14. Memory cells 15 may have a well-known configuration as shown in FIG. 7, in which a capacitor 15a and a source-drain circuit of a MOS transistor 15b are serially connected between the bit line 4 and the ground, and the gate electrode of the MOS transistor 15b is connected to the word line 14.

In FIG. 5, a dummy word line (DW) 16 is disposed in parallel with the word line 14 and intersects the bit lines 4. The dummy word line 16 is used to apply a falling signal when a rising signal is applied in the word line 14, thereby preventing noise from being introduced in the bit line 4. Such noise may occur on the bit line 4 because of the coupling capacitance between the word line 14 and the bit line 4. Use of the dummy word line 16 is particularly advantageous in the open bit line configuration to which the invention pertains.

A dummy memory cell, not shown, may be connected to the dummy word line 16. The dummy memory cell should preferably have a capacitance equal to or smaller than that of the memory cell 15.

Figure 6:
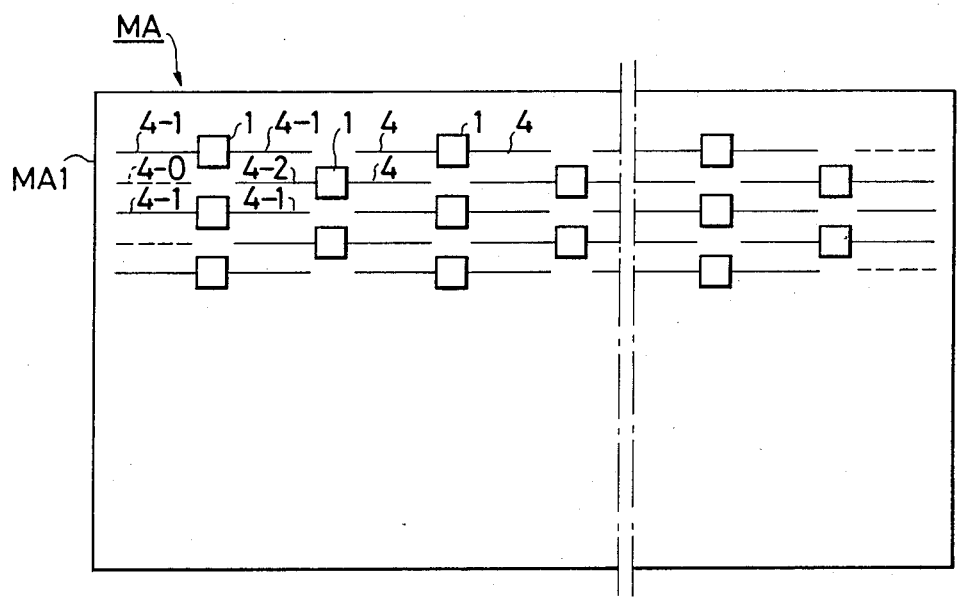
FIG. 6 is a schematic diagram showing the entire memory cell array with the bit line layout as shown in FIG. 5.

In FIG. 5 and FIG. 6, dummy bit lines 4-0 are provided to extend between the leftmost bit lines 4-1 for the columns which are once removed (i.e., two columns over) from each other and between the sense amplifiers of these leftmost bit line 4-1 and the left edge MA1 of the memory cell array MA. Similary, dummy bit lines 4-0 (not shown) are provided to extend between the rightmost bit lines 4-2 for the columns which are once removed from each other and between the sense amplifiers 1 of these rightmost bit lines 4-2 and the right edge (not shown) of the memory cell array MA. The dummy bit lines 4-0 may for example be fixed to the ground potential, rather than being at a floating potential. If the dummy bit lines 4-0 were not provided, the pitch of the bit lines 4 in the leftmost area or the rightmost area of the memory cell array MA would be twice that in other areas, so that the capacitance between the adjacent bit lines 4 would differ between the two halves or oppositely extending portions of each bit line 4. The dummy bit lines 4-0 are provided to prevent such an imbalance.

Figure 8:
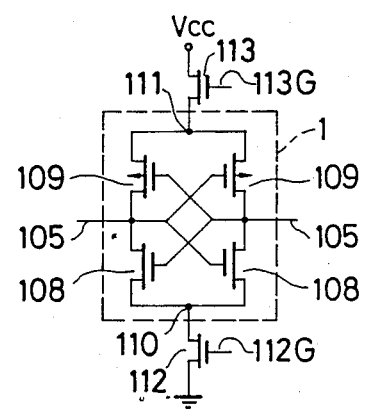
FIG. 8 is a schematic diagram showing an example of a sense amplifier incorporated in the embodiment of FIG. 5.

FIG. 8 shows an example of the sense amplifier 1. It comprises two sets of cross-coupled CMOS inverters, each comprising an N-channel MOS transistor 108 and a P-channel MOS transistor 109. An activated node 110, which is a common junction between the two N-channel MOS transistors 108, is coupled to the ground by a MOS switch in the form of an N-channel MOS transistor 112. An activated node 111, which is a common junction between the two P-channel MOS transistors 109, is coupled to the power supply, Vcc by a MOS switch in the form of a P-channel MOS transistor 113. The MOS transistors 112 and 113 are normally used to activate a plurality of sense amplifiers 1. When the potential of the gate electrode 112G of the MOS transistor 112 is high, and when the potential of the gate electrode 113G of the MOS transistor 113 is low, these MOS transistors 112 and 113 become ON and the sense amplifier 1 becomes activated, i.e., assumes the state in which it performs the amplification.

In the embodiment of FIG. 5, since the bit lines 4-1 and 4-2 for the columns adjacent each other are offset or staggered vertically by half their length in the vertical direction, and the bit line 4 for each column is so formed that neither of its ends 1x overlap with the sense amplifier 1 or the column decoder 5 of the bit line 4 of the adjacent column, the restriction on the layout of the sense amplifiers 1 and the column decoders 5 is relaxed. That is, the sense amplifiers 1-1, 1-2 and the column decoders 5 can be disposed in the space between vertically adjacent and horizontally adjacent portions of bit lines 4. In the prior art configuration, it was necessary that the sense amplifiers 1 be accomodated along horizontal lines with each bit line. This made it necessary for the pitch of the bit lines 4 to be large, and as a result prevented increase of the degree of the integration. The above described embodiment of the present invention removed this problem and made it possible to accomodate the sense amplifiers and the column decoders 5 without disrupting the required spacing between vertically adjacent bit lines 4 and without enlarging the pitch horizontally adjacent bit lines 4. This contributes to realization of a highly integrated, e.g., 16Mbit, or 64Mbit semiconductor memory device.

Figure 9:
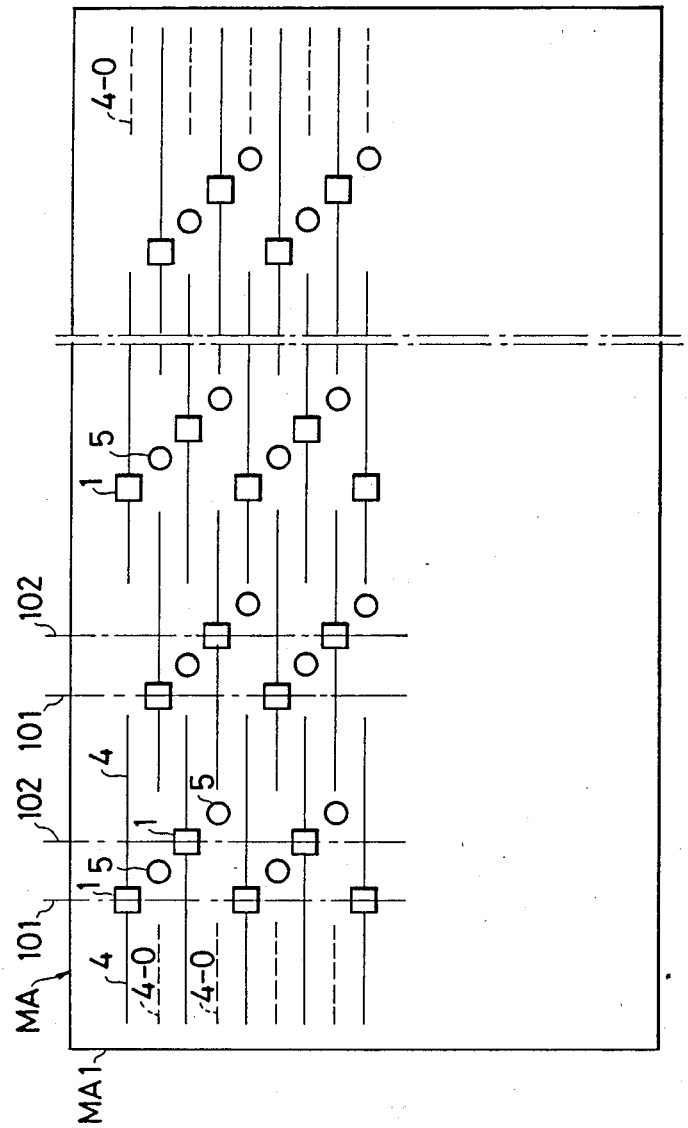
FIG. 9 is a schematic diagram showing a second embodiment of the semiconductor memory device according to the invention.

FIG. 9 shows a second embodiment of the invention. The same reference numerals as in the description of the first embodiment indicated identical elements. This embodiment is nearly identical with the first embodiment. The difference is that the sense amplifiers 1 and the column decoders 5 along the vertically adjacent bit lines 4 are not aligned along a vertical line but are staggered. More specifically, the sense amplifiers 1 of the bit lines 4 for alternate rows are aligned along a first line 101 extending in the vertical direction, and the sense amplifiers 1 of the bit lines 4 for the intervening rows are aligned along a second line 102 parallel with the first line. The column decoders 5 are disposed adjacent the respective sense amplifiers 1. With such an arrangement, the area available for each sense amplifier 1 can be increased. Conversely, if the area for each sense amplifier 1 is unchanged, the pitch of the bit lines 4 can be further decreased.

Figure 10:
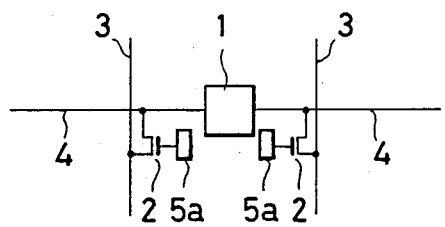
FIG. 10 is a schematic diagram showing a modification of a layout of a decoder in the region near the sense amplifier.

In the above embodiments, the column decoders 5 are disposed on one side of the respective sense amplifiers 1. Alternatively, each decoder 5 can be divided into two halves 5a, 5a and disposed on both sides of each sense amplifier 1, as shown in FIG. 10.

Figure 11:
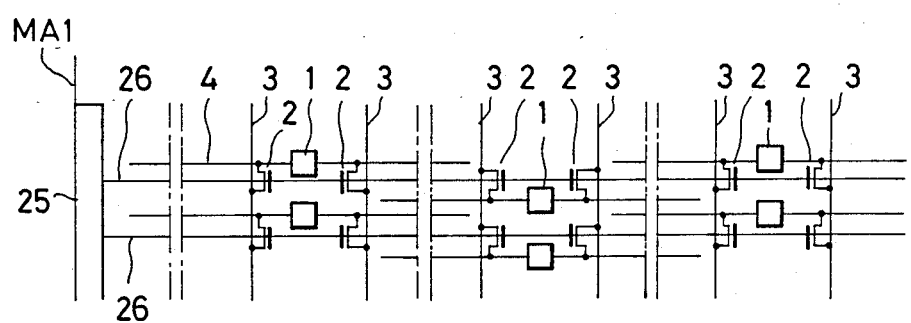
FIG. 11 is a schematic diagram showing another modification of a layout for the column decoder.

In an alternative arrangement, the column decoders 25 are disposed along one of the edges, e.g., the leftmost edge MA1 of the memory cell array MA, and the switches 2 are connected through decode lines 26, 26 extending parallel with the bit lines 1, as shown in FIG. 11.

What is claimed is:

1. A semiconductor memory device of an open bit line configuration, comprising:
    a plurality of memory cells arranged in rows and columns;
    a plurality of periodically spaced, vertically-extending word lines for performing row selection of said plurality of memory cells;
    a plurality of sense amplifiers arranged in rows and columns, each of said sense amplifiers respectively having an open bit line composed of a left bit line portion and a right bit line portion, said left and right bit line portions extending horizontally in opposite directions from the respective said sense amplifier for performing column selection of said plurality of memory cells; the sense amplifiers within each column being separated from each other by a predetermined vertical distance and the sense amplifiers within each row being separated from each other at a periodic spacing;
    each of said open bit lines in corresponding rows in alternate columns being at substantially the same height, and each of said open bit lines in adjacent columns in corresponding adjacent rows being staggered in a vertical direction relative to each other by about half said predetermined vertical distance
    the left bit line portions of the sense amplifiers which are disposed in a single column overlapping in a vertical direction with the right bit line portions of the sense amplifiers which are disposed in an adjacent column; each of said left and right bit line portions of the sense amplifiers which are disposed in a single column terminating such that they do not overlap in the vertical direction with the sense amplifiers which are disposed in an adjacent column.

2. A semiconductor memory device according to claim 1, further comprising a plurality of data bus lines extending vertically and spaced such that a pair of said data bus lines are disposed adjacent to and on opposite sides of each column of sense amplifiers, each pair of said plurality of data bus lines being electrically connected to opposite terminals of all of the sense amplifiers in the column, and dummy word lines disposed horizontally between bit line portions for alternate columns, said dummy word lines being connected to outermost ones of said plurality of data bus lines between the sense amplifiers of these bit lines.

3. A semiconductor memory device according to claim 2, wherein each of said plurality of dummy word lines is electrically connected to a ground potential.

4. A semiconductor memory device according to claim 1, wherein the sense amplifiers in adjacent columns are separated by a fixed horizontal distance.

5. A semiconductor memory device according to claim 1, wherein alternate columns of said plurality of sense amplifiers are spaced apart a first horizontal distance, and adjacent columns of said plurality of sense amplifiers are spaced apart a second horizontal distance which is substantially shorter than said first horizontal distance.

6. A semiconductor memory device according to claim 1, further comprising a plurality of switches which are respectively connected to said plurality of sense amplifiers, and a plurality of column decoders which are respectively connected to said plurality of switches for controlling operation of the respective sense amplifiers.

7. A semiconductor memory device according to claim 6, wherein each of said column decoders includes a first portion and a second portion which are disposed on opposite sides of and adjacent to the respective sense amplifier.

8. A semiconductor memory device according to claim 1, further comprising a plurality of switches which are respectively connected to said plurality of sense amplifiers, a plurality of column decoders disposed in a single column, and a plurality of horizontally extending decode lines connecting each one of said plurality of column decoders with all of the switches lying in a corresponding single row.

* * * * *